US012575293B2

(12) United States Patent
Jang et al.

(10) Patent No.: US 12,575,293 B2
(45) Date of Patent: Mar. 10, 2026

(54) DISPLAY DEVICE

(71) Applicant: Samsung Display Co., LTD., Yongin-si (KR)

(72) Inventors: Sunggyu Jang, Anyang-si (KR); Su Jeong Kim, Seoul (KR); Kyunghee Lee, Suwon-si (KR); Taeho Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 430 days.

(21) Appl. No.: 18/096,487

(22) Filed: Jan. 12, 2023

(65) Prior Publication Data

US 2023/0240113 A1     Jul. 27, 2023

(30) Foreign Application Priority Data

Jan. 24, 2022     (KR) ......................... 10-2022-0010111

(51) Int. Cl.
| | |
|---|---|
| *H10K 59/38* | (2023.01) |
| *H10K 59/12* | (2023.01) |
| *H10K 59/40* | (2023.01) |
| *H10K 59/80* | (2023.01) |

(52) U.S. Cl.
CPC ......... *H10K 59/38* (2023.02); *H10K 59/1201* (2023.02); *H10K 59/40* (2023.02); *H10K 59/873* (2023.02)

(58) Field of Classification Search
None
See application file for complete search history.

(56) References Cited

U.S. PATENT DOCUMENTS

| | | | |
|---|---|---|---|
| 2019/0273122 A1 | 9/2019 | Iwasaki et al. | |
| 2020/0075682 A1 | 3/2020 | Jeong et al. | |
| 2023/0078264 A1* | 3/2023 | Choi ...................... | H10K 59/38 |
| | | | 313/506 |

FOREIGN PATENT DOCUMENTS

| | | |
|---|---|---|
| JP | 2019153411 A | 9/2019 |
| KR | 10-1076262 | 10/2011 |
| KR | 10-2018-0082661 | 7/2018 |
| KR | 10-2020-0025980 A | 3/2020 |
| KR | 10-2021-0060707 | 5/2021 |
| KR | 10-2297664 | 9/2021 |

* cited by examiner

*Primary Examiner* — Kyoung Lee
(74) *Attorney, Agent, or Firm* — Womble Bond Dickinson (US) LLP

(57) ABSTRACT

A display device may include a substrate, a light emitting structure on the substrate, a thin film encapsulation layer on the light emitting structure, a color filter layer on the thin film encapsulation layer and including a red color filter selectively transmitting a red light, a green color filter selectively transmitting a green light, and a blue color filter selectively transmitting a blue light, and an overcoat layer on the color filter layer and including at least one selected from a dye and a pigment, wherein an upper surface of the red color filter may be lower than an upper surface of the green color filter and an upper surface of the blue color filter, and wherein a height of the upper surface of the green color filter and a height of the upper surface of the blue color filter may be equal to each other.

17 Claims, 10 Drawing Sheets

FIG. 2

F I G . 3
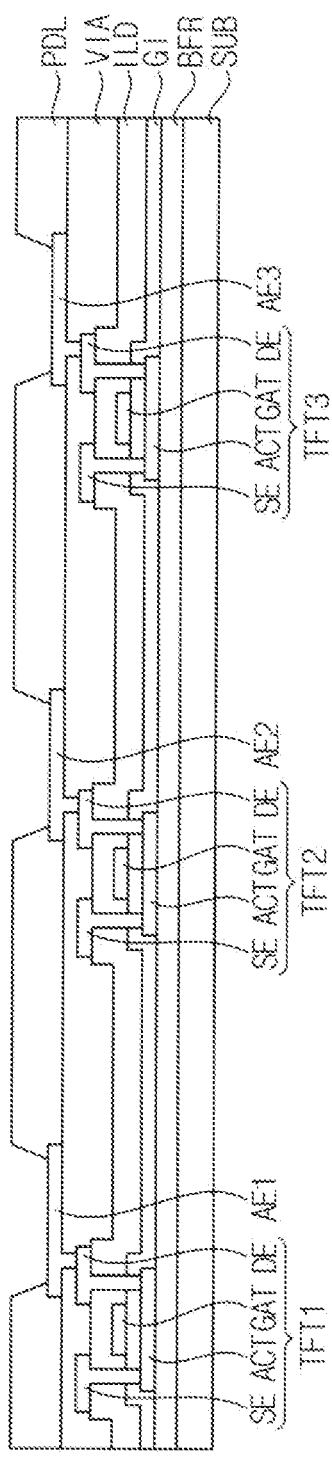

DISPLAY DEVICE

CROSS-REFERENCED TO RELATED APPLICATION

This application claims priority to and the benefit of Korean Patent Application No. 10-2022-0010111, filed on Jan. 24, 2022, in the Korean Intellectual Patent Office, the content of which in its entirety is herein incorporated by reference.

BACKGROUND

1. Field

Embodiments of the present disclosure relate to a display device. More specifically, embodiments of the present disclosure relate to a display device with an improved display quality.

2. Description of the Related Art

A display device includes a plurality of pixels to display an image and a pixel electrode, an emission layer, and a common electrode may be disposed in one of the pixels. Light having a color (e.g. red, green, or blue) set by applying a voltage to the pixel electrode and the common electrode may be emitted from the emission layer.

In some embodiments, as light incident from the outside of the display device (hereinafter, an external light) is reflected from the pixel electrode, the color of the light emitted from the emission layer may be blurred.

SUMMARY

Aspects of embodiments are directed toward a display device with improved display quality by reducing a reflectance by an external light.

Additional aspects will be set forth in part in the description which follows and, in part, will be apparent from the description, or may be learned by practice of the presented embodiments of the disclosure.

A display device according to an embodiment may include a substrate, a light emitting structure disposed on the substrate, a thin film encapsulation layer disposed on the light emitting structure, a color filter layer disposed on the thin film encapsulation layer and including a red color filter selectively transmitting (or to selectively transmit) a red light, a green color filter selectively transmitting (or to selectively transmit) a green light, and a blue color filter selectively transmitting (or to selectively transmit) a blue light and an overcoat layer disposed on the color filter layer and including at least one selected from a dye and a pigment. An upper surface of the red color filter may be lower than an upper surface of the green color filter and an upper surface of the blue color filter and a height of the upper surface of the green color filter and a height of the upper surface of the blue color filter may be equal to each other.

In an embodiment, the overcoat layer may include a first portion overlapping the upper surface of the red color filter, a second portion overlapping the upper surface of the green color filter, and the third portion overlapping the upper surface of the blue color filter. The thickness of the first portion may be greater than a thickness of the second portion and a thickness of the third portion and the thickness of the second portion and the thickness of the third portion may be equal to each other.

In an embodiment, the dye may include a first dye and a second dye. A maximum absorption wavelength of the first dye may be about 580 nm to about 590 nm and a maximum absorption wavelength of the second dye may be about 420 nm to about 440 nm.

In an embodiment, the pigment may include a green pigment and a yellow pigment.

In an embodiment, a total content (e.g., amount) of the dye and the pigment may be about 5 wt % or less based on a total weight of the overcoat layer.

In an embodiment, a content (e.g., amount) of the dye may be about 0.01 wt % to about 2.5 wt % based on the total weight of the overcoat layer and a content (e.g., amount) of the pigment may be about 0.01 wt % to about 2.5 wt % based on the total weight of the overcoat layer.

A display device according to another embodiment may include a substrate, a light emitting structure disposed on the substrate, a thin film encapsulation layer disposed on the light emitting structure, a color filter layer disposed on the thin film encapsulation layer and including a red color filter selectively transmitting a red light, a green color filter selectively transmitting a green light, and a blue color filter selectively transmitting a blue light and an overcoat layer disposed on the color filter layer and including at least one selected from a dye and a pigment. An upper surface of the blue color filter may be higher than an upper surface of the red color filter and an upper surface of the green color filter and a height of the upper surface of the red color filter and a height of the upper surface of the green color filter may be equal to each other.

In an embodiment, the overcoat layer may include a first portion overlapping the upper surface of the red color filter, a second portion overlapping the upper surface of the green color filter, and the third portion overlapping the upper surface of the blue color filter. A thickness of the third portion may be smaller than a thickness of the first portion and a thickness of the second portion and the thickness of the first portion and the thickness of the second portion may be equal to each other.

In an embodiment, the upper surface of the blue color filter may be higher than the upper surface of the red color filter and the upper surface of the green color filter by about 0.5 μm to about 1.5 μm.

In an embodiment, the dye may include a third dye and a fourth dye. A maximum absorption wavelength of the third dye may be about 590 nm to about 610 nm and a maximum absorption wavelength of the fourth dye may be about 480 nm to about 500 nm.

In an embodiment, the third dye may include a tetraazaporphyrin-based dye and the fourth dye may include a porphyrin-based dye.

In an embodiment, the pigment may include a yellow pigment.

In an embodiment, the light transmitting part may include a scattering particle for scattering an incident light.

A display according to another embodiment may include a substrate, a light emitting structure disposed on the substrate, a thin film encapsulation layer disposed on the light emitting structure, a color filter layer disposed on the thin film encapsulation layer and including a red color filter selectively transmitting a red light, a green color filter selectively transmitting a green light, and a blue color filter selectively transmitting a blue light and an overcoat layer disposed on the color filter layer and including at least one selected from a dye and a pigment. An upper surface of the red color filter may be lower than an upper surface of the green color filter and the upper surface of the green color filter may be lower than an upper surface of the blue color filter.

In an embodiment, the overcoat layer may include a first portion overlapping the upper surface of the red color filter, a second portion overlapping the upper surface of the green color filter, and the third portion overlapping the upper surface of the blue color filter. A thickness of the first portion may be greater than a thickness of the second portion and the thickness of the second portion may be greater than the thickness of the third portion.

In an embodiment, the upper surface of the red color filter may be lower than the upper surface of the green color filter by about 0.5 μm to about 1.5 μm and the upper surface of the green color filter may be lower than the upper surface of the blue color filter by about 0.5 μm to about 1.5 μm.

In an embodiment, the dye includes a fifth dye and a sixth dye. A maximum absorption wavelength of the fifth dye may be about 590 nm to about 610 nm and a maximum absorption wavelength of the sixth dye may be about 500 nm to about 520 nm.

In an embodiment, the fifth dye may include a tetraazaporphyrin-based dye and the sixth dye includes a porphyrin-based dye.

In an embodiment, the pigment may include a yellow pigment

BRIEF DESCRIPTION OF THE DRAWINGS

Illustrative, non-limiting embodiments will be more clearly understood from the following detailed description taken in conjunction with the accompanying drawings.

FIG. 2 is a cross-sectional view illustrating the display device of FIG. 1 according to an embodiment of the present disclosure.

FIGS. 3-8 are cross-sectional views illustrating a method of manufacturing the display device of FIG. 1 according to an embodiment of the present disclosure.

FIG. 9 is a cross-sectional view illustrating a display device according to another embodiment of the present disclosure.

FIG. 10 is a cross-sectional view illustrating a display device according to still another embodiment of the present disclosure.

DETAILED DESCRIPTION

Figure 1:
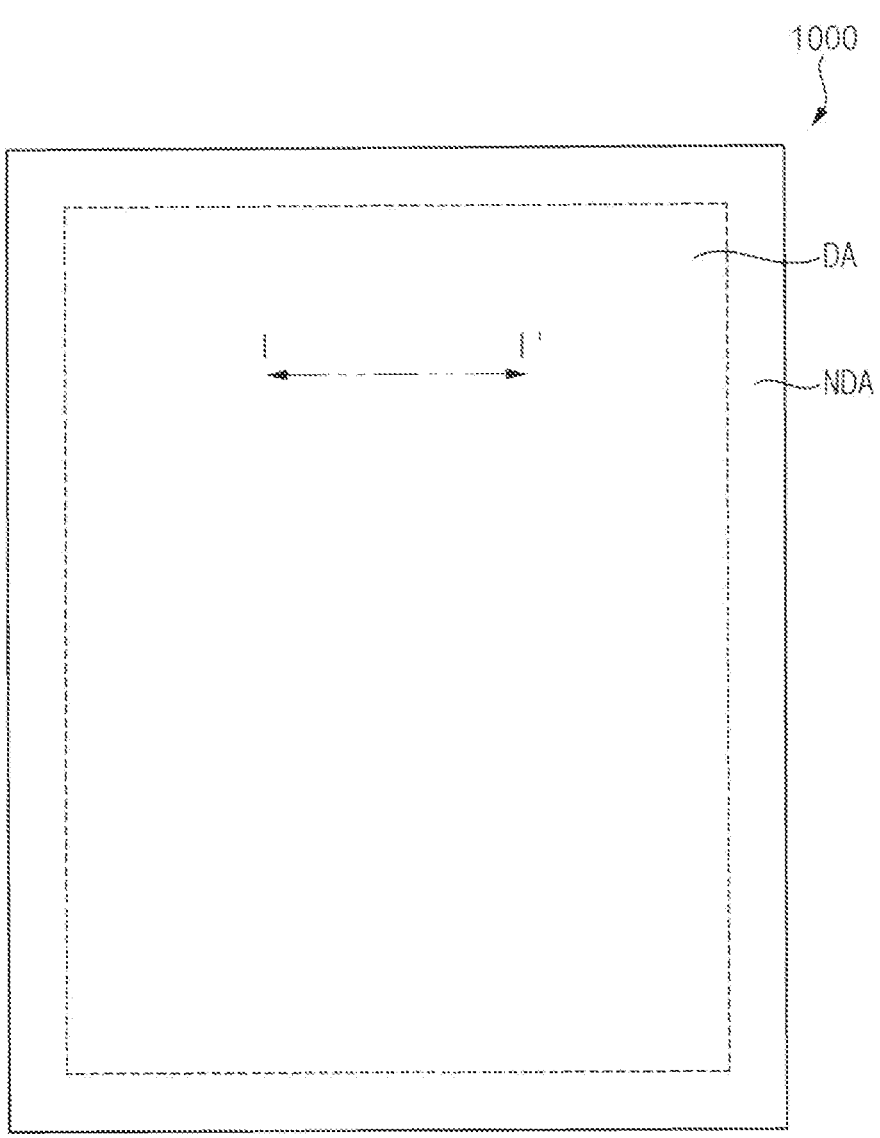
FIG. 1 is a plan view illustrating a display device according to an embodiment of the present disclosure.

The present disclosure now will be described more fully hereinafter with reference to the accompanying drawings, in which one or more suitable embodiments are shown. This present disclosure may, however, be embodied in many different forms, and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout, and duplicative descriptions thereof may not be provided.

FIG. 1 is a plan view illustrating a display device according to an embodiment of the present disclosure.

Referring to FIG. 1, a display device 1000 may be divided into a display area DA and a non-display area NDA. For example, the display area DA may have a rectangular shape, and the non-display area NDA may be positioned to be around (e.g., to surround) the display area DA. At least one pixel may be disposed in the display area DA, and an image may be displayed through the pixel in the display area DA. Driving parts for driving the pixel may be disposed in the non-display area NDA. The driving parts may provide a signal and/or a voltage to the pixel. The pixel may emit light in response to the signal and/or the voltage.

Figure 2:
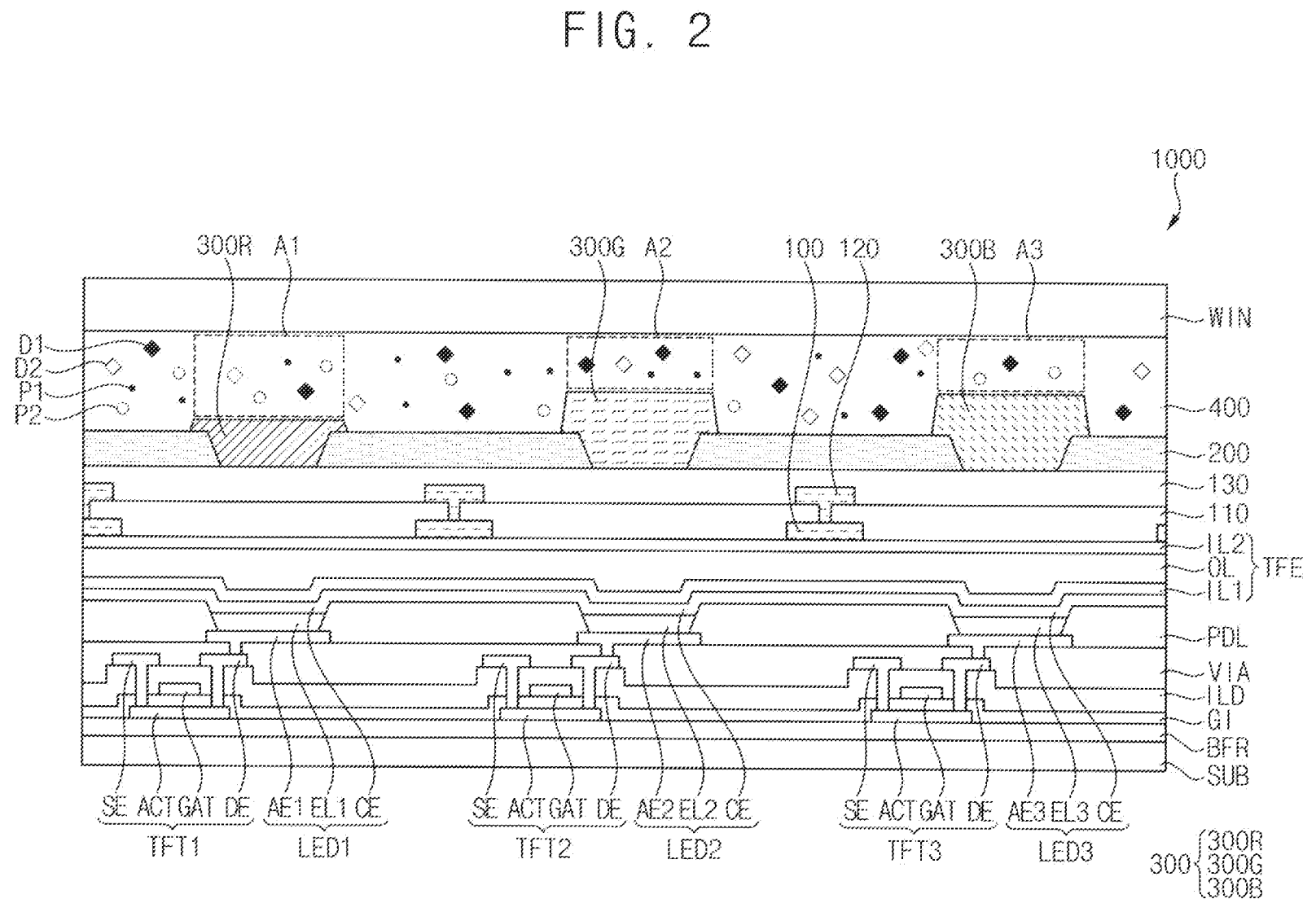

FIG. 2 is a cross-sectional view illustrating the display device of FIG. 1 according to an embodiment of the present disclosure. For example, FIG. 2 is a cross-sectional view taken along line I-I' of FIG. 1.

Referring to FIG. 2, the display device 1000 may include a substrate SUB, a buffer layer BFR, first to third transistors TFT1, TFT2, and TFT3, a via insulating layer VIA, a pixel defining layer PDL, first to third light emitting structures LED1, LED2, LED3, a thin film encapsulation layer TFE, a first touch electrode 100, a touch insulating layer 110, a second touch electrode 120, a touch protecting layer 130, a black matrix 200, a color filter layer 300, an overcoat layer 400, and a window WIN.

The substrate SUB may include a transparent or opaque material. In an embodiment, examples of the material that may be included in the substrate SUB may include a glass, a quartz, a plastic, and/or the like. Such materials may be used alone or in combination with each other. When the substrate SUB is formed of glass having rigidity, the display device 1000 may be implemented as a rigid display device. When the substrate SUB is formed of flexible plastic, the display device 1000 may be implemented as a flexible display device.

The buffer layer BFR may be disposed on the substrate SUB. The buffer layer BFR may prevent or reduce metal atoms or impurities from diffusing from the substrate SUB to an active pattern ACT. In some embodiments, the buffer layer BFR may control a rate of providing heat during a crystallization process for forming the active pattern ACT. In an embodiment, the buffer layer BFR may be formed of an insulating material. Examples of the insulating material that may be utilized as the buffer layer BFR may include silicon oxide, silicon nitride, silicon oxynitride, and/or the like. Such materials may be utilized alone or in combination with each other. The buffer layer BFR may have a single-layered structure or a multi-layered structure including a plurality of insulating layers The first to third transistors TFT 1, TFT2, and TFT3 may be disposed on the buffer layer BFR. In an embodiment, each of the first to third transistors TFT1, TFT2, and TFT3 may generate a driving current to supply the driving current to the first to third light emitting structures LED1, LED2, and LED3. Each of the first to third transistors TFT1, TFT2, and TFT3 may include the active pattern ACT, a gate electrode GAT, a source electrode SE, and a drain electrode DE.

The active pattern ACT may be disposed on the buffer layer BFR. In an embodiment, the active pattern ACT may be formed of a silicon semiconductor material, an oxide semiconductor material, or an organic semiconductor material. Examples of the oxide semiconductor material that may be used as the active pattern ACT may include indium (In), gallium (Ga), tin (Sn), zirconium (Zr), vanadium (V), hafnium (Hf), and cadmium (Cd), germanium (Ge), chromium (Cr), titanium (Ti), and zinc (Zn), and/or the like. In some embodiments, examples of the silicon semiconductor material that may be used as the active pattern ACT may include amorphous silicon, polycrystalline silicon, and/or the like. The active pattern ACT may include a source region, a drain region, and a channel region positioned between the source region and the drain region.

A gate insulating layer GI may be disposed on the active pattern ACT. The gate insulating layer GI may cover the active pattern ACT. In an embodiment, the gate insulating layer GI may be formed of an insulating material. Examples of the insulating material that may be used as the gate insulating layer GI may include silicon oxide, silicon nitride, silicon oxynitride, and/or the like. Such materials may be used alone or in combination with each other.

The gate electrode GAT may be disposed on the gate insulating layer GI. The gate electrode GAT may overlap the active pattern ACT. In an embodiment, the gate electrode GAT may be formed of a metal, an alloy, a conductive metal oxide, a transparent conductive material, and/or the like. Examples of the material that may be used as the gate electrode GAT may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy containing aluminum, an alloy containing silver, an alloy containing copper, an alloy containing molybdenum, aluminum nitride (AlN), tungsten nitride (WN), titanium nitride (TiN), chromium Nitride (CrN), Tantalum Nitride (TaN), Strontium Ruthenium Oxide (SrRuO), Zinc Oxide (ZnO), Indium Tin Oxide (ITO), Tin Oxide (SnO), Indium Oxide (InO), Gallium Oxide (GaO), Indium and zinc oxide (IZO), and/or the like. Such materials may be used alone or in combination with each other. The gate electrode GAT may have a single-layered structure or a multi-layered structure including a plurality of conductive layers.

An interlayer insulating layer ILD may be disposed on the gate electrode GAT. The interlayer insulating layer ILD may cover the gate electrode GAT. In an embodiment, the interlayer insulating layer ILD may be formed of an insulating material. Examples of the insulating material that may be used as the interlayer insulating layer ILD may include silicon oxide, silicon nitride, silicon oxynitride, and/or the like. Such materials may be used alone or in combination with each other.

The source electrode SE and the drain electrode DE may be disposed on the interlayer insulating layer ILD. The source electrode SE may contact the source region of the active pattern ACT and the drain electrode DE may contact the drain region of the active pattern ACT. In an embodiment, the source electrode SE and the drain electrode DE may be formed of a metal, an alloy, a conductive metal oxide, a transparent conductive material, and/or the like.

The via insulating layer VIA may be disposed on the source electrode and the drain electrode DE. The via insulating layer VIA may cover the source electrode SE and the drain electrode DE. The via insulating layer VIA may be formed of an insulating material. Examples of the insulating material that may be used as the via insulating layer VIA may include a photoresist, a polyacryl-based resin, a polyimide-based resin, a polyamide-based resin, a siloxane-based resin, an acrylic-based resin, and an epoxy-based resin. Such materials may be used alone or in combination with each other. The via insulating layer VIA may have a single-layered structure or a multi-layered structure including a plurality of insulating layers.

First to third pixel electrodes AE1, AE2, and AE3 may be disposed on the via insulating layer VIA. Each of the first to third pixel electrodes AE1, AE2, and AE3 may include a conductive material such as a metal, an alloy, a conductive metal nitride, a conductive metal oxide, a transparent conductive material, and/or the like. Each of the first to third pixel electrodes AE1, AE2, and AE3 may have a single-layered structure or a multi-layered structure including a plurality of conductive layers.

The first to third pixel electrodes AE1, AE2, and AE3 may be electrically connected to the first to third transistors TFT, TFT2, and TFT3 through contact holes formed in the via insulating layer VIA, respectively.

The pixel defining layer PDL may be disposed on the first to third pixel electrodes AE1, AE2, and AE3. The pixel defining layer PDL may be formed of an insulating material. Examples of the insulating material that may be used as the pixel defining layer PDL may include a photoresist, a polyacryl-based resin, polyimide-based resin, polyamide-based resin, siloxane-based resin, acrylic-based resin, and epoxy-based resin. Such materials may be used alone or in combination with each other. The pixel defining layer PDL may define openings respectively exposing at least a portion of each of the first to third pixel electrodes AE1, AE2, and AE3. An emission area and a non-emission area of the display device 1000 may be defined by the openings. For example, a portion in which the openings defined by the pixel defining layer PDL is positioned may correspond to the emission area and a portion in which the pixel defining layer PDL is disposed may correspond to the non-emission area.

First to third emission layers EL1, EL2, and EL3 may be disposed on the first to third pixel electrodes AE, AE2, and AE3 exposed by the openings defined by the pixel defining layer PDL, respectively. In an embodiment, the first to third light emission layers EL1, EL2, and EL3 may have a multi-layered structure including a hole injection layer, a hole transport layer, an electron transport layer, an electron injection layer, and/or the like. In this case, the hole injection layer, the hole transport layer, the electron transport layer, the electron injection layer may be formed in substantially the same manner for each of the openings.

In an embodiment, the first emission layer EL1 may include a light emitting material emitting a red light, the second emission layer EL2 may include a light emitting material emitting a green light, and the third emission layer EL3 may include a light emitting material emitting a blue light. In this case, the color filter layer 300 may include a red color filter 300R, a green color filter 300G, and a blue color filter 300B corresponding to the light emitting materials.

A common electrode CE may be disposed on the first to third emission layers EL1, EL2, and EL3. The common electrode CE may include a conductive material such as a metal, an alloy, a conductive metal nitride, a conductive metal oxide, a transparent conductive material, and/or the like. The common electrode CE may have a single-layered structure or a multi-layered structure including a plurality of conductive layers. In an embodiment, the common electrode CE may continuously extend over the plurality of pixels in the display area DA.

The first pixel electrode AE1, the first emission layer EL1, and the common electrode CE may form the first light emitting structure LED1. The second pixel electrode AE2, the second emission layer EL2, and the common electrode CE may form the second light emitting structure LED2. The third pixel electrode AE3, the third light emitting layer EL3, and the common electrode CE may form the third light emitting structure LED3.

In some embodiments, a light emitting structure included in the display device 1000 may not be limited to the first to third light emitting structures LED1, LED2, and LED3. For example, the light emitting structure may be a light emitting diode including at least one selected from a micro light emitting diode (micro-LED), a nano light emitting diode (nano-LED), a quantum dot (QD), and a quantum rod (QR).

The thin film encapsulation layer TFE may be disposed on the first to third light emitting structures LED1, LED2, and LED3. The thin film encapsulation layer TFE may prevent or reduce impurities from penetrating into the first to third light emitting structures LED1, LED2, and LED3. The thin film encapsulation layer TFE may include at least one organic layer and at least one inorganic layer. In an embodiment, the thin film encapsulation layer TFE may include a first inorganic layer IL1, an organic layer OL, and a second inorganic layer IL2. However embodiments are no limited thereto.

The first inorganic layer IL1 may be disposed on the common electrode CE. In an embodiment, the first inorganic layer IL1 may be formed of an inorganic material. Examples of the inorganic material that may be used as the first inorganic layer IL1 may include silicon oxide, silicon nitride, silicon oxynitride, and/or the like. Such materials may be used alone or in combination with each other.

The organic layer OL may be disposed on the first inorganic layer IL1. In an embodiment, the organic layer OL may be formed of an organic material. Examples of the organic material that may be used as the organic layer OL may include a photoresist, a polyacryl-based resin, a polyimide-based resin, a polyamide-based resin, a siloxane-based resin, an acrylic-based resin, an epoxy-based resin, and/or the like. Such materials may be used alone or in combination with each other.

The second inorganic layer IL2 may be disposed on the organic layer OL. In an embodiment, the second inorganic layer IL2 may be formed of an inorganic material. Examples of the inorganic material that may be used as the second inorganic layer IL2 may include silicon oxide, silicon nitride, silicon oxynitride, and/or the like. Such materials may be used alone or in combination with each other.

The first touch electrode 100 may be disposed on the thin film encapsulation layer TFE. In an embodiment, the first touch electrode 100 may be disposed in the non-emission area of the display device 1000. The first touch electrode 100 may be formed of a metal, an alloy, a conductive metal oxide, a transparent conductive material, and/or the like.

The touch insulating layer 110 may be disposed on the thin film encapsulation layer TFE on which the first touch electrode 100 is disposed. The touch insulating layer 110 may cover the first touch electrode 100. The touch insulating layer 110 may be formed of an insulating material. Examples of the insulating material that may be used as the touch insulating layer 110 may include silicon oxide, silicon nitride, silicon oxynitride, and/or the like. Such materials may be used alone or in combination with each other.

The second touch electrode 120 may be disposed on the touch insulating layer 110 and overlap the first touch electrode 100. The second touch electrode 120 may be electrically connected to the first touch electrode 100 through a contact hole formed in the first touch insulating layer 110. The second touch electrode 120 may be formed of a metal, an alloy, a conductive metal oxide, a transparent conductive material, and/or the like.

The first touch electrode 100 and the second touch electrode 120 may form a touch electrode. In an embodiment, the touch electrode may have a mesh structure in a plan view. However, embodiments are not limited thereto, and the touch electrode may have one or more suitable shapes.

The touch protecting layer 130 may be disposed on the touch insulating layer 110 on which the second touch electrode 120 is disposed. The touch protecting layer 130 may cover the second touch electrode 120. The touch protecting layer 130 may be formed of an insulating material. Examples of the insulating material that may be used as the touch protecting layer 130 may include silicon oxide, silicon nitride, silicon oxynitride, and/or the like. Such materials may be used alone or in combination with each other. The touch protecting layer 130 may have a substantially flat upper surface.

The black matrix 200 may be disposed in the non-emission area of the display device 1000. In an embodiment, the black matrix 200 may have a black color. The black matrix 200 may absorb most of the external light incident on the black matrix 200. Accordingly, the black matrix 200 may prevent or reduce or reduce external light reflection. Examples of the material that may be used as the black matrix 200 may include chromium (Cr), chromium oxide (CrOx), chromium nitride (CrNx), carbon black, a pigment mixture, a dye mixture, and/or the like. Such materials may be used alone or in combination with each other.

The color filter layer 300 may be disposed on the touch protecting layer 130 on which the black matrix 200 is disposed. The color filter layer 300 may partially overlap the black matrix 200. A color of the light emitted from the light emitting structures LED1, LED2, and LED3 may be more clearly recognized as it passes through the color filter layer 300.

In an embodiment, the color filter layer 300 may include a plurality of color filters 300R, 300G, and 300B. The plurality of color filters 300R, 300G, and 300B may be disposed to be spaced apart from each other. Each of the color filters 300R, 300G, and 300B may transmit a light of a specific wavelength band. Accordingly, each of the color filters 300R, 300G, and 300B may be a wavelength selective optical filter that selectively transmits only a partial wavelength of incident light.

In an embodiment, the color filters 300R, 300G, and 300B may include a red color filter 300R, a green color filter 300G, and a blue color filter 300B. When the first emission layer EU emits a red light, the second emission layer EL2 emits a green light, and the third emission layer EL3 emits a blue light, the plurality of color filters 300R, 300G, 300B may be arranged correspondingly.

In some embodiments, because the display device 1000 includes the color filter layer 300, the reflectance by the external light may be reduced without a separate polarizing element disposed thereon. Accordingly, a weight and a thickness of the display device 1000 may be reduced. In some embodiments, visibility of the display device 1000 may be improved.

The overcoat layer 400 may be disposed on the color filter layer 300. The overcoat layer 400 may cover the black matrix 200 and the color filter layer 300. Accordingly, the reliability of the black matrix 200 and the color filter layer 300 may be improved. The overcoat layer 400 may have a substantially flat upper surface. Accordingly, the overcoat layer 400 may compensate for the step difference of the lower surface. The overcoat layer 400 may be formed of an organic material. Examples of the organic material that may be used as the overcoat layer 400 may include a photoresist, a polyacryl-based resin, a polyimide-based resin, an acrylic resin, an epoxy-based resin, an acrylate-based resin, and/or the like. Such materials may be used alone or in combination with each other.

The overcoat layer 400 may include at least one selected from a dye and a pigment. For example, the dye and the pigment may be included in the overcoat layer 400 alone or in combination with each other. The dye and the pigment may be included in the overcoat layer 400 while being dispersed in the organic material. The dye and the pigment may reduce a light transmittance of the overcoat layer 400 by absorbing a portion of the light passing through the overcoat layer 400. Accordingly, it is possible to further reduce the reflectance by the external light.

In an embodiment, a total content (e.g., amount) of the dye and the pigment may be about 5 wt % or less based on the total weight of the overcoat layer 400. For example, a content (e.g., amount) of the dye may be about 0.01 wt % to about 2.5 wt % based on the total weight of the overcoat layer 400 and a content (e.g., amount) of the pigment may be about 0.01 wt % to about 2.5 wt % based on the total weight of the overcoat layer 400. When the contents of the dye and the pigment satisfies the above-described ranges, the reflectance by the external light may be further reduced and the display quality of the display device 1000 may be further improved.

In an embodiment, the reflectance of the display device 1000 by the external light may be adjusted according to the light transmittance of the overcoat layer 400 for each wavelength band. For example, in case that a light transmittance of about 600 nm to about 650 nm wavelength is substantially similar to a light transmittance of approximately about 500 nm to about 550 nm wavelength and the light transmittance of about 600 nm to about 650 nm wavelength is lower than a light transmittance of about 450 nm to about 480 nm wavelength when the light transmittance of the overcoat layer 400 is measured, the reflectance of the display device 1000 by external light may be further reduced. In other words, in order to reduce the reflectance by the external light, it may be required to adjust the light transmittance of the overcoat layer 400 for each wavelength band.

According to embodiments, the light transmittance of the overcoat layer 400 for each wavelength band may be adjusted according to a relative height of upper surfaces of the red color filter 300R, the green color filter 300G, and the blue color filter 300B. In other words, by setting the relative height of the upper surfaces of the red color filter 300R, the green color filter 300G, and the blue color filter 300B, it may possible to set a relative thickness of the portions A1, A2, and A3 in which the overcoat layer 400 overlaps to each of the upper surfaces of the color filters 300R, 300G, and 300B. Accordingly, the light transmittance of the overcoat layer 400 for each wavelength band may be adjusted. Accordingly, the reflectance of the display device 1000 by the external light may be reduced.

In this case, the relative height of the upper surfaces of the red color filter 300R, the green color filter 300G, and the blue color filter 300B may be variously set according to an initial light transmittance for each wavelength band according to a composition of the overcoat layer 400. For example, the relative height of the upper surfaces of the color filters 300R, 300G, and 300B suitable for reducing the reflectance of the display device 1000 by the external light may be variously set according to the composition of the overcoat layer 400.

For example, in the display device 1000, the upper surface of the red color filter 300R may be lower than the upper surface of the green color filter 300G and the upper surface of the blue color filter 300B and a height of the upper surface of the green color filter 300G and a height of the upper surface of the blue color filter 300B may be equal to each other.

In other words, a thickness of the first portion A1 in which the overcoat layer 400 overlaps the upper surface of the red color filter 300R may be greater than a thickness of the second portion A2 in which the overcoat layer 400 overlaps the upper surface of the green color filter 300G and a thickness of the third portion A3 in which the overcoat layer 400 overlaps the upper surface of the blue color filter 300B. In some embodiments, the thickness of the second portion A2 and the thickness of the third portion A3 may be equal to each other.

Accordingly, when the light transmittance of the overcoat layer 400 for each wavelength band is measured, the light transmittance of about 600 nm to about 650 nm wavelength may be substantially similar to the light transmittance of about 500 nm to about 550 nm wavelength and the light transmittance of about 600 nm to about 650 nm wavelength may be kept lower than the light transmittance of about 450 nm to about 480 nm wavelength. Accordingly, the color purity of the light emitted from the light emitting structures LED1, LED2, and LED3 may be improved, the reflectance by the external light may be reduced, and the display quality of the display device 1000 may be improved.

In an embodiment, the upper surface of the red color filter 300R may be lower than the upper surface of the green color filter 300G and the upper surface of the blue color filter 300B by about 0.5 μm to about 1.5 μm. For example, the thickness of the first portion A1 of the overcoat layer 400 may be greater than the thickness of the second portion A2 and the thickness of the third portion A3 of the overcoat layer 400 by about 0.5 μm to about 1.5 μm. When a difference of height between the upper surface of the red color filter 300R and the upper surface of the green color filter 300G and the upper surface of the blue color filter 300B satisfies the above-described range, the reflectance by the external light may be further reduced and the display quality of display device 1000 may be further improved.

When the upper surface of the red color filter 300R is lower than the upper surface of the green color filter 300G and the upper surface of the blue color filter 300B and the upper surface of the green color filter 300G and the upper surface of the blue color filter 300B are equal to each other, as an example of the composition of the overcoat layer 400 in which the reflectance by the external light of the display device 1000 is reduced, the overcoat layer 400 may include a first dye D1, a second dye D2, a yellow pigment P1 and a green pigment P2.

Hereinafter, the first dye D1, the second dye D2, the yellow pigment P1, and the green pigment P2 will be described in more detail.

The first dye D1 may have a maximum absorption wavelength of about 580 nm to about 590 nm. Accordingly, the first dye D1 may absorb a light of a neon wavelength band. The second dye D2 may have a maximum absorption wavelength of about 420 nm to about 440 nm. Accordingly, the second dye D2 may absorb a light of a blue wavelength band. Accordingly, the first dye D1 and the second dye D2 may be mixed with each other to reduce a light transmittance of a specific wavelength band without affecting a light transmittance of other wavelength bands.

In an embodiment, examples of the dye that can be used as the first dye D1 and the second dye D2 may include a tetraazaporphyrin-based dye, a porphyrin-based dye, an oxazine-based dye, a squaraine-based dye, a triarylmethane-based dye, a polymethine-based dye, an anthraquinone-based dye, a phthalocyanine-based dye, an azo-based dye, a perylene-based dye, a xanthene-based dye, a dimonium-based dye, and/or the like. For example, the first dye D1 may be a tetraazaporphyrin-based dye and the second dye D2 may be a porphyrin-based dye. The maximum absorption wavelength of the first dye D1 and the second dye D2 may be realized by adjusting substituents of each dye.

In an embodiment, a content (e.g., amount) of each of the first dye D1 and the second dye D2 may be about 0.01 wt % to about 0.5 wt % based on the total weight of the overcoat layer 400. When the content (e.g., amount) of each of the first dye D1 and the second dye D2 satisfies the above-described ranges, the reflectance by the external light may be further reduced and the display quality of the display device 1000 may be further improved.

Similarly, the yellow pigment P1 and the green pigment P2 may be mixed with each other to reduce a light transmittance of a specific wavelength band without affecting a light transmittance of other wavelength bands.

The yellow pigment P1 and the green pigment P2 may be suitable pigments commonly used among pigments having yellow and green color, respectively. For example, the yellow pigment P1 may include a yellow pigment or a yellowish pigment and C.I. Pigment yellow-based pigments may be used for the yellow pigment P1. Examples of the C.I. pigment yellow-based pigment may include Pigment Yellow 13, Pigment Yellow 55, Pigment Yellow 119, Pigment Yellow 138, Pigment Yellow 139, Pigment Yellow 168, Pigment Yellow 185, and/or the like. In some embodiments, the green pigment P2 may include a green pigment or a greenish pigment and C.I. Pigment green-based pigments may be used for the green pigment P2. Examples of the C.I. pigment green-based pigments may include Pigment Green 7, Pigment Green 36, and/or the like. For example, the yellow pigment P1 may be Pigment Yellow 185, and the green pigment P2 may be Pigment Green 7.

In an embodiment, a content (e.g., amount) of each of the yellow pigment P1 and the green pigment P2 may be about 0.01 wt % to about 0.5 wt % based on the total weight of the overcoat layer 400. When the content (e.g., amount) of each of the yellow pigment P1 and the green pigment P2 satisfies the above-described ranges, the reflectance by the external light may be further reduced and the display quality of the display device 1000 may be further improved.

A window WIN may be disposed on the overcoat layer 400. In an embodiment, examples of materials that may be used as the window WIN may include a glass, a quartz, a plastic, and/or the like. Such materials may be used alone or in combination with each other. The window WIN may protect the above-described components from external forces.

FIGS. 3 to 8 are cross-sectional views illustrating a method of manufacturing the display device of FIG. 1 according to an embodiment of the present disclosure.

Hereinafter, a method of manufacturing the display device 1000 of FIG. 1 will be briefly described with reference to FIGS. 3 to 8.

First, referring to FIG. 3, the buffer layer BFR may be formed on the substrate SUB. Thereafter, the active pattern ACT may be formed on the buffer layer BFR. the gate insulating layer GI may be formed on the buffer layer BFR on which the active pattern ACT is formed. The gate electrode GE may be formed on the gate insulating layer GI. The interlayer insulating layer ILD may be formed on the gate insulating layer GI on which the gate electrode GE is formed. The source electrode SE and the drain electrode DE may be formed on the interlayer insulating layer ILD. The via insulating layer VIA may be formed on the interlayer insulating layer ILD on which the source electrode SE and the drain electrode DE are formed. The pixel electrodes AE1, AE2, and AE3 may be formed on the via insulating layer VIA. The pixel defining layer PDL defining the openings exposing the pixel electrodes AE1, AE2, and AE3 may be formed on the via insulating layer VIA on which the pixel electrodes AE1, AE2, and AE3 are formed.

Figure 4:
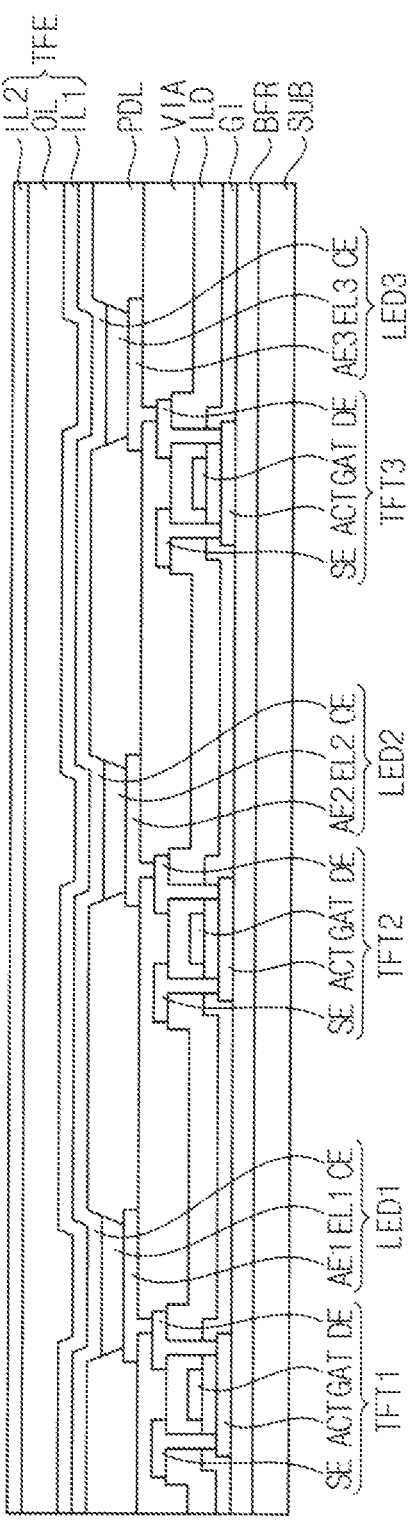

Referring to FIG. 4, the emission layers EL1, EL2, EL3 and the common electrode CE may be sequentially formed on the pixel electrodes AE1, AE2, and AE3. The thin film encapsulation layer TFE may be formed on the common electrode CE. The thin film encapsulation layer TFE may be formed in the order of the first inorganic layer IL1, the organic layer OL, and the second inorganic layer IL2.

Figure 5:
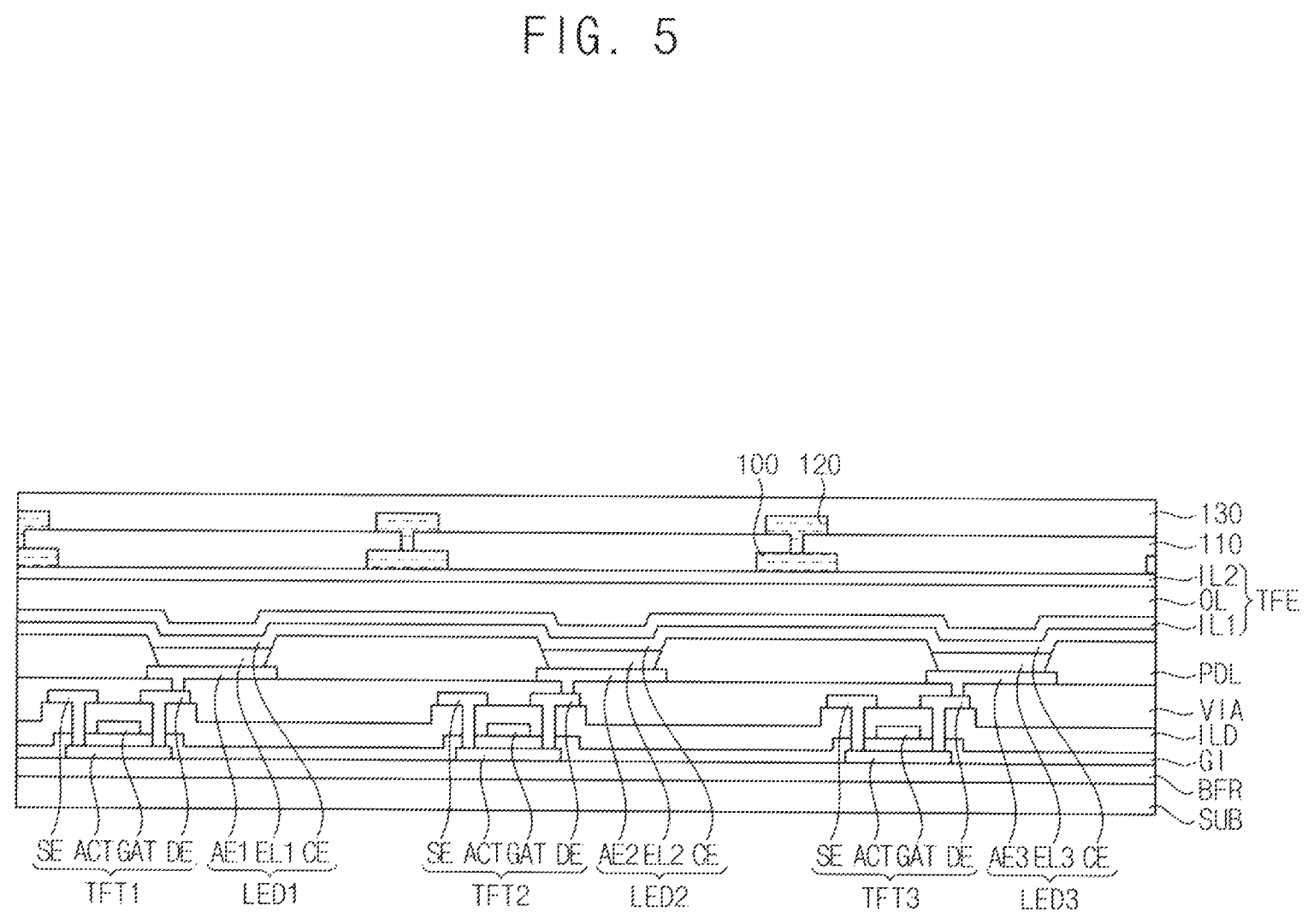

Referring to FIG. 5, the first touch electrode 100 may be formed on the thin film encapsulation layer TFE. The touch insulating layer 110 may be formed on the thin film encapsulation layer TFE on which the first touch electrode 100 is formed. The second touch electrode 120 may be formed on the touch insulating layer 110. The touch protecting layer 130 may be formed on the touch insulating layer 110 on which the second touch electrode 120 is formed.

Figure 6:
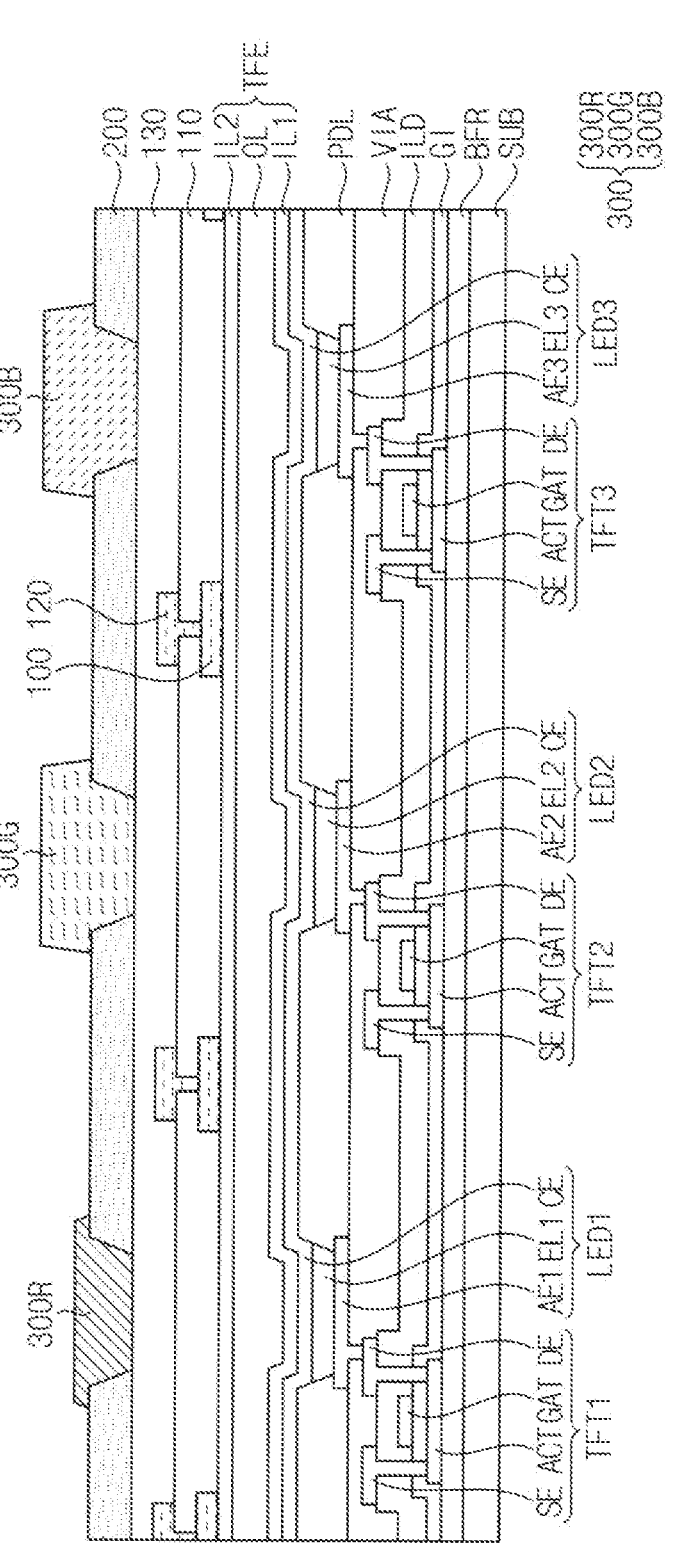

Referring to FIG. 6, the black matrix 200 may be formed on the touch protecting layer 130. The black matrix 200 may be formed to correspond to the non-emission area in which the pixel defining layer PDL is disposed. Subsequently, the color filter layer 300 may be formed on the touch protecting layer 130 and the black matrix 200. In an embodiment, the color filter layer 300 may include the plurality of color filters 300R, 300G, and 300B. In this case, the upper surface of the red color filter 300R may be lower than the upper surface of the green color filter 300G and the upper surface of the blue color filter 300B. Further, the upper surface of the green color filter 300G and the upper surface of the blue color filter 300B may be equal to each other. In FIG. 6, the color filter layer 300 may overlap the black matrix 200 and be formed on the black matrix 200, but embodiments are not limited thereto. For example, the plurality of color filters 300R, 300G, and 300B may be formed to correspond to areas between the black matrices 200 arranged at regular intervals.

Figure 7:
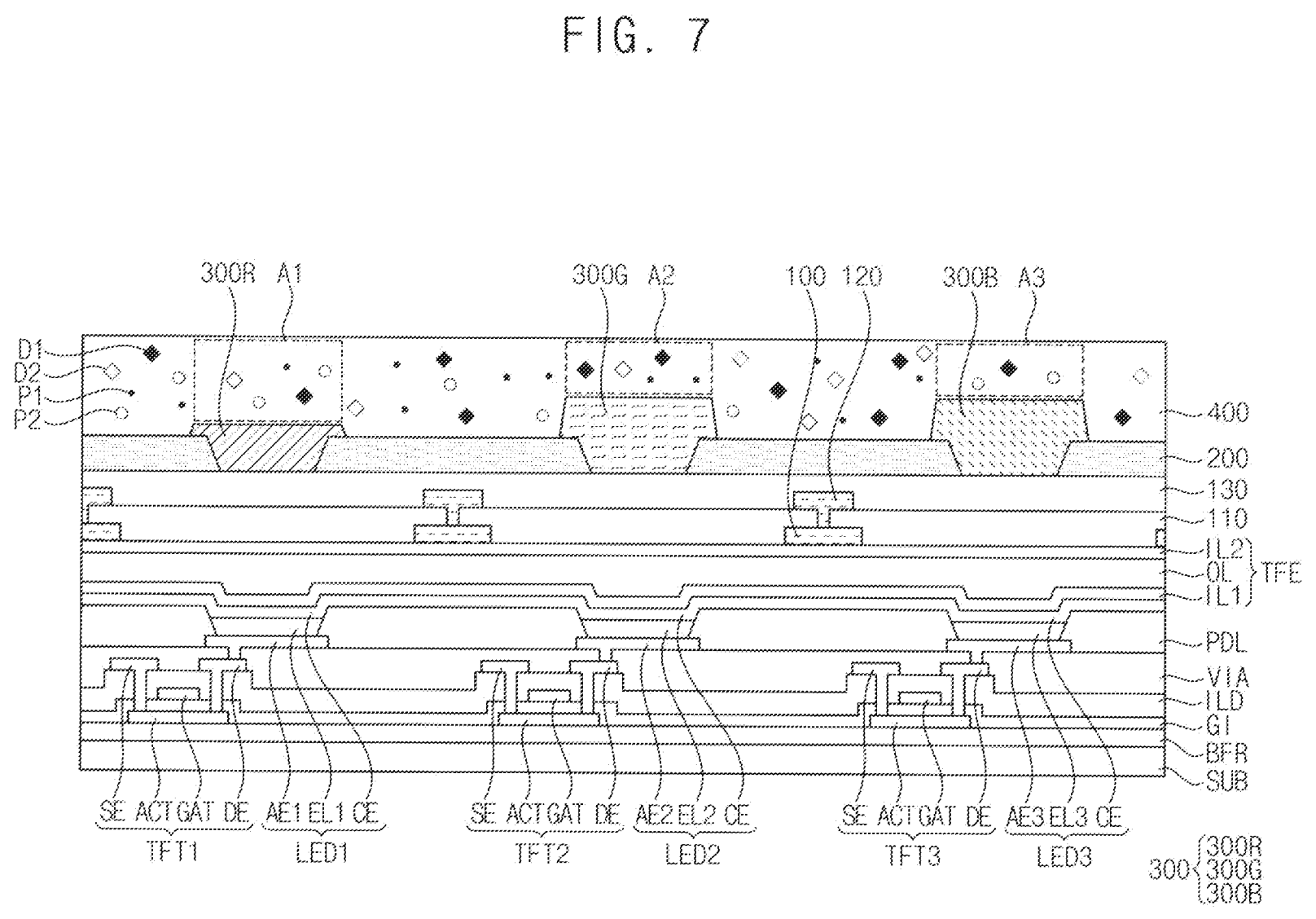

Referring to FIG. 7, the overcoat layer 400 may be formed on the black matrix 200 and the color filter layer 300. The overcoat layer 400 may be in direct contact with the color filter layer 300. The overcoat layer 400 may include the organic material such as a photoresist, a polyacryl-based resin, a polyimide-based resin, an acrylic resin, an epoxy-based resin, an acrylate-based resin, and/or the like. In some embodiments, the overcoat layer 400 may include at least one selected from the dye and the pigment. For example, the dye and the pigment may be included in the overcoat layer 400 alone or in combination with each other. The dye and the pigment may be included in the overcoat layer 400 while being dispersed in the organic material.

Figure 8:
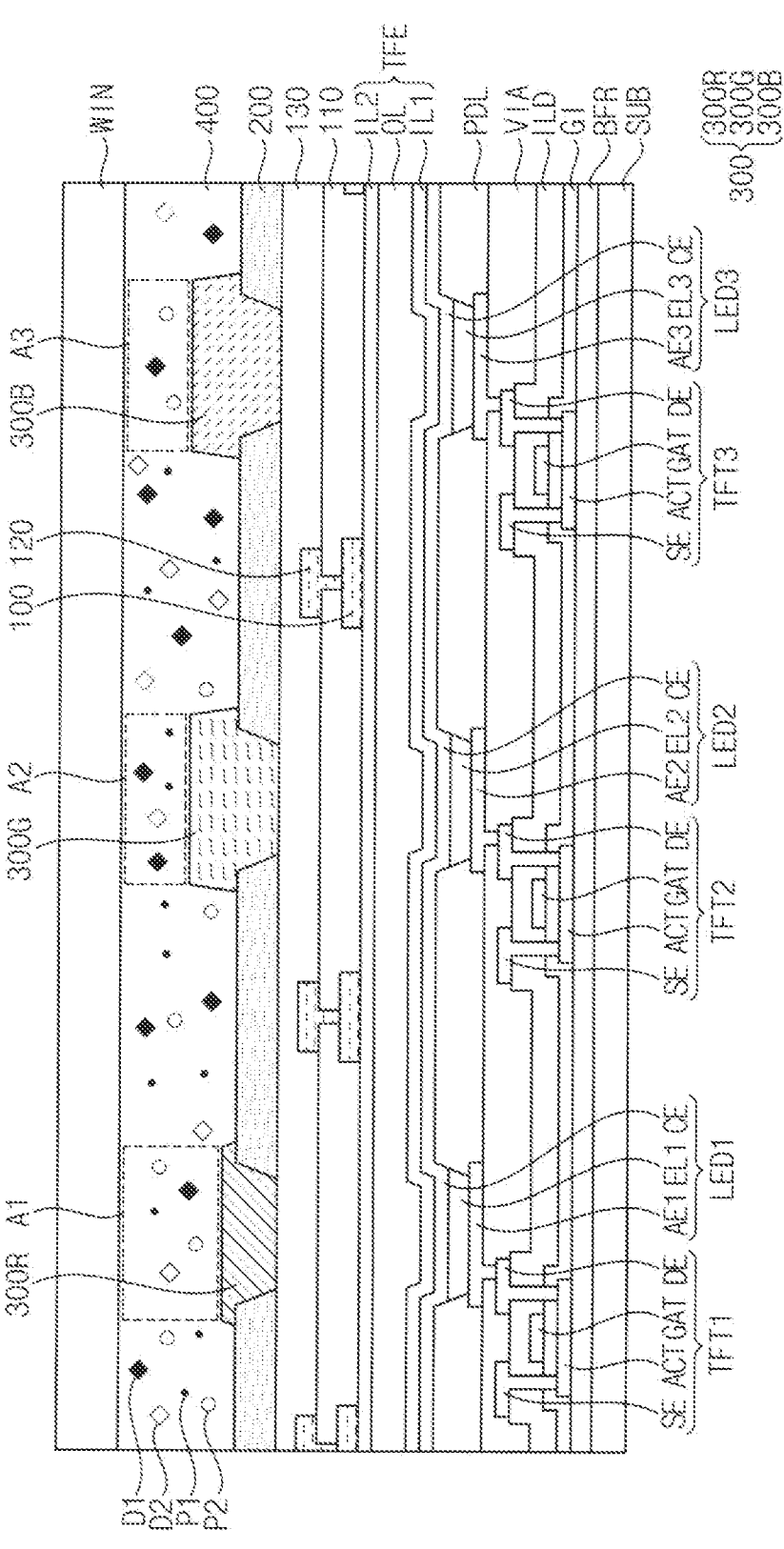

Referring to FIG. 8, the window WIN may be disposed on the overcoat layer 400. In an embodiment, an adhesive layer may be interposed on the overcoat layer 400, and the window WIN may be disposed on the adhesive layer.

Figure 9:
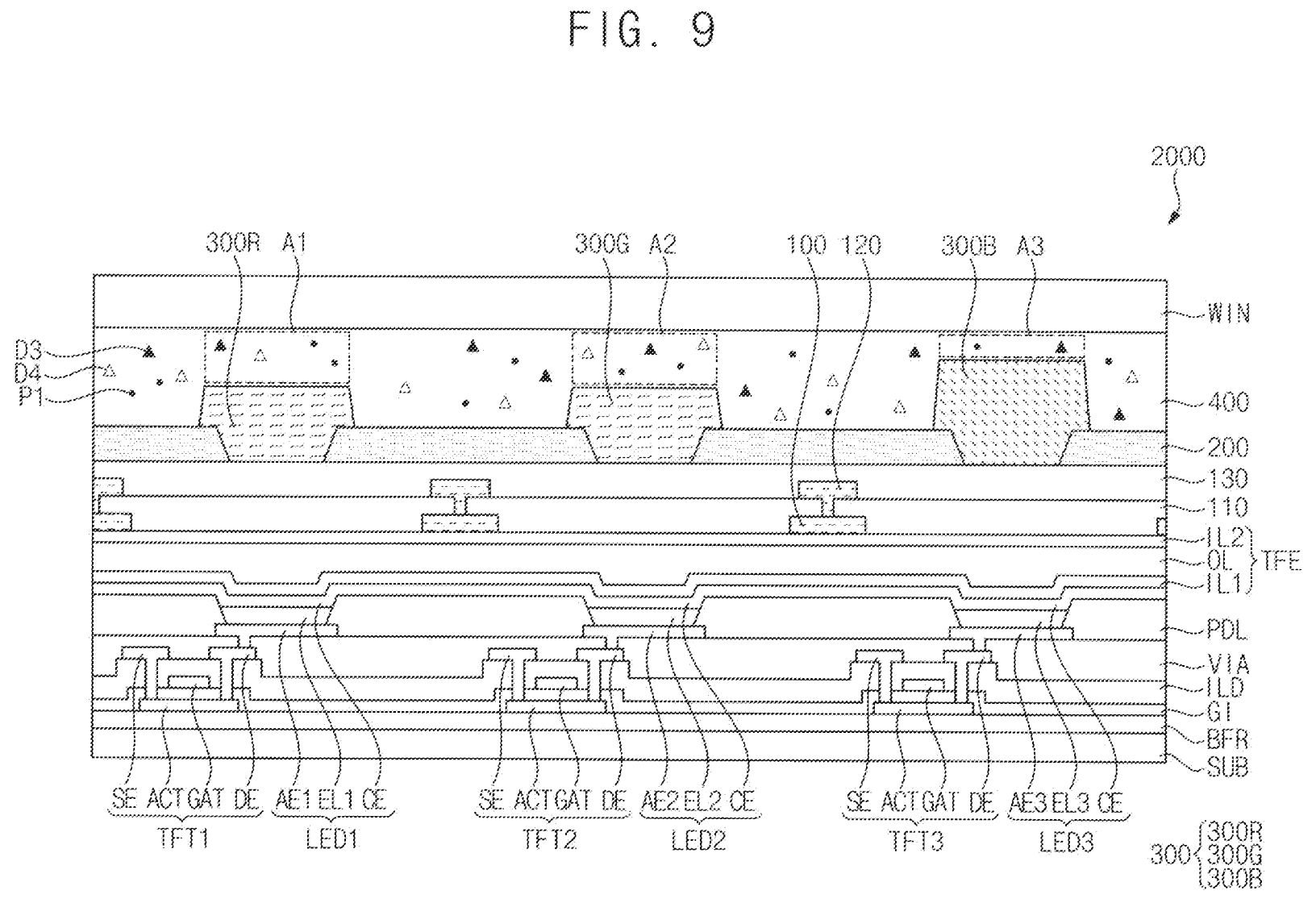

FIG. 9 is a cross-sectional view illustrating a display device according to another embodiment.

An embodiment of a display device 2000 shown in FIG. 9 may be substantially same as the embodiment of the display device 1000 described above with reference to FIGS. 1 to 8, except for the relative height of the upper surfaces of the red color filter 300R, the green color filter 300G, and the blue color filter 300B and the composition of the overcoat layer 400.

In an embodiment, in the display device 2000, the upper surface of the blue color filter 300B may be higher than the upper surface of the red color filter 300R and the upper surface of the green color filter 300G and the height of the upper surface of the red color filter 300R and the height the upper surface of the green color filter 300G may be equal to each other.

In other words, the thickness of the third portion A3 in which the overcoat layer 400 overlaps the upper surface of the blue color filter 300B may be smaller than the thickness of the first portion A1 in which the overcoat layer 400 overlaps the upper surface of the red color filter 300R and the thickness of the second portion A2 in which the overcoat layer 400 overlaps the upper surface of the green color filter 300G and the thickness of the first portion A1 and the thickness of the second portion A2 may be equal to each other.

Accordingly, when the light transmittance of the overcoat layer 400 is measured, the light transmittance of about 600 nm to about 650 nm wavelength may be substantially similar to the light transmittance of about 500 nm to about 550 nm wavelength and the light transmittance of about 600 nm to about 650 nm wavelength may be kept lower than the light transmittance of about 450 nm to about 480 nm wavelength. Accordingly, the color purity of the light emitted from the light emitting structures LED1, LED2, and LED3 may be further improved and the reflectance by the external light may be further reduced. Accordingly, the display quality of the display device 2000 may be further improved.

In an embodiment, the upper surface of the blue color filter 300B may be higher than the upper surface of the red color filter 300R and the upper surface of the green color filter 300G by about 0.5 μm to about 1.5 μm. For example, the thickness of the third portion A3 of the overcoat layer 400 may be smaller than the thickness of the first portion A1 and the thickness of the second portion A2 of the overcoat layer 400 by about 0.5 μm to about 1.5 μm. When a difference of height between the upper surfaces of the plurality of color filters 300R, 300G, and 300B satisfies the above-described range, the reflectance by the external light may be further reduced and the display quality of display device 2000 may be further improved.

When the upper surface of the blue color filter 300B is higher than the upper surface of the red color filter 300R and the upper surface of the green color filter 300G, and the upper surface of the red color filter 300R and the upper surface of the green color filter 300G are equal to each other, as an example of the composition of the overcoat layer 400 in which the reflectance by the external light of the display device 2000 is reduced, the overcoat layer 400 may include a third dye D3, a fourth dye D4 and a yellow pigment P1.

Hereinafter, the third dye D3, the fourth dye D4, and the yellow pigment P1 will be described in more detail.

The third dye D3 may have a maximum absorption wavelength of about 590 nm to about 610 nm. Accordingly, the third dye D3 may absorb the light of a neon wavelength band. The fourth dye D4 may have a maximum absorption wavelength of about 480 nm to about 500 nm. Accordingly, the fourth dye D4 may absorb a light of a cyan wavelength band. Accordingly, the third dye D3 and the fourth dye D4 may be mixed with each other to reduce a light transmittance of a specific wavelength band without affecting a light transmittance of other wavelength bands.

In an embodiment, examples of the dye that can be used as the third dye D3 and the fourth dye D4 may include a tetraazaporphyrin-based dye, a porphyrin-based dye, an oxazine-based dye, a squaraine-based dye, a triarylmethane-based dye, a polymethine-based dye, an anthraquinone-based dye, a phthalocyanine-based dye, an azo-based dye, a perylene-based dye, a xanthene-based dye, a dimonium-based dye, and/or the like. For example, the third dye D3 may be a tetraazaporphyrin-based dye and the fourth dye D4 may be a porphyrin-based dye. The maximum absorption wavelength of the third dye D3 and the fourth dye D4 may be realized by adjusting substituents of each dye.

In an embodiment, a content (e.g., amount) of each of the third dye D3 and the fourth dye D4 may be about 0.01 wt % to about 0.5 wt % based on the total weight of the overcoat layer 400. When the content (e.g., amount) of each of the third dye D3 and the fourth dye D4 satisfies the above-described ranges, the reflectance by the external light may be further reduced and the display quality of the display device 2000 may be further improved.

Similarly, the yellow pigment P1 may reduce a light transmittance of a specific wavelength band without affecting a light transmittance of other wavelength bands.

The yellow pigment P1 and the green pigment P2 may be suitable pigments commonly used among pigments having yellow and green color, respectively. For example, the yellow pigment P1 may include a yellow pigment or a yellowish pigment and C.I. Pigment yellow-based pigments may be used for the yellow pigment P1. Examples of the C.I. pigment yellow-based pigment may include Pigment Yellow 13, Pigment Yellow 55, Pigment Yellow 119, Pigment Yellow 138, Pigment Yellow 139, Pigment Yellow 168, Pigment Yellow 185, and/or the like. For example, the yellow pigment P1 may be Pigment Yellow 185.

In an embodiment, a content (e.g., amount) of the yellow pigment P1 may be about 0.01 wt % to about 0.5 wt % based on the total weight of the overcoat layer 400. When the content (e.g., amount) of the yellow pigment P1 satisfies the above-described ranges, the reflectance by the external light may be further reduced and the display quality of the display device 2000 may be further improved.

Figure 10:
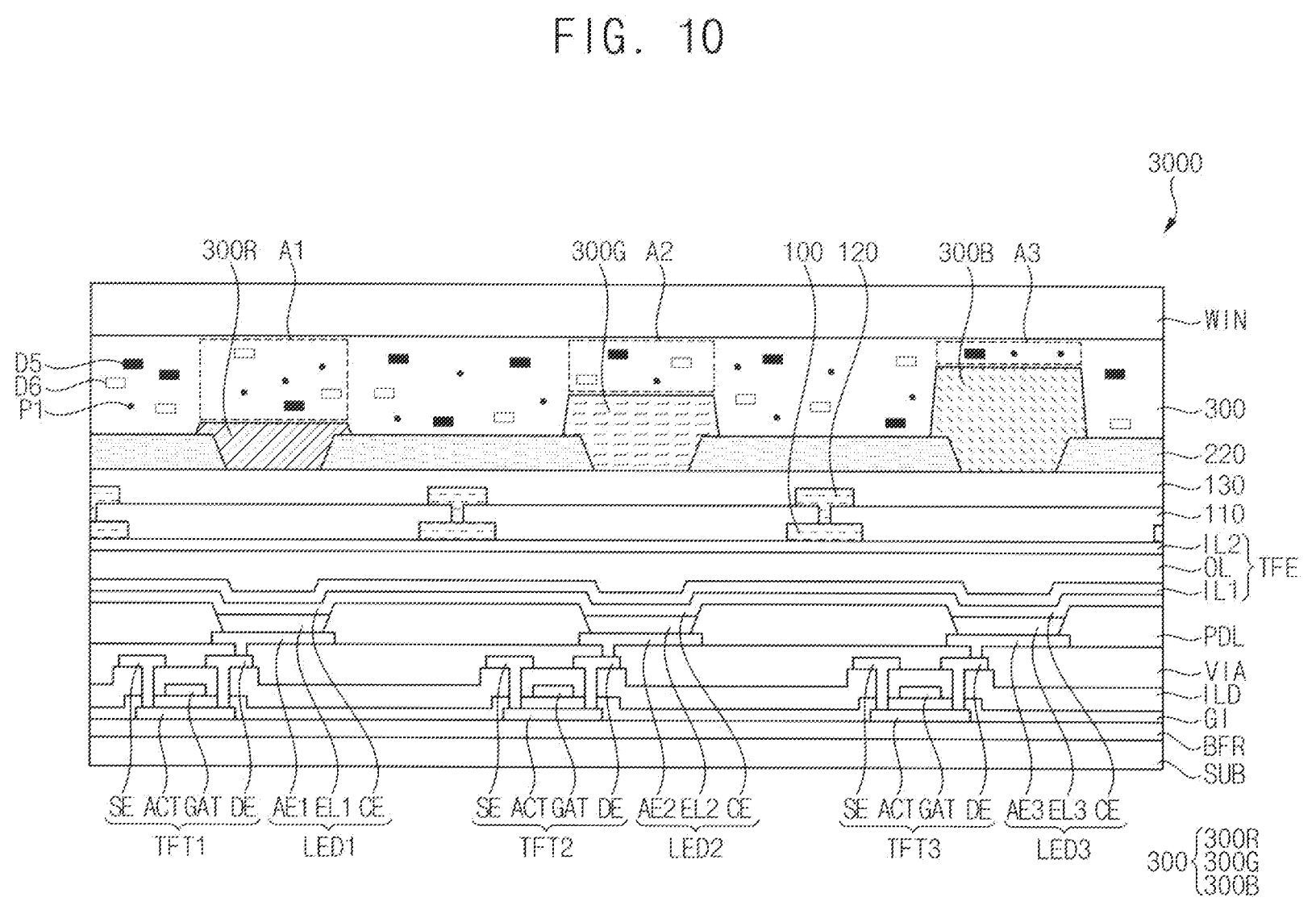

FIG. 10 is a cross-sectional view illustrating a display device according to another embodiment of the present disclosure.

An embodiment of a display device 3000 shown in FIG. 10 may be substantially the same as the embodiment of the display device 1000 described above with reference to FIGS. 1 to 8, except for the relative height of the upper surfaces of the red color filter 300R, the green color filter 300G, and the blue color filter 300B and the composition of the overcoat layer 400.

In an embodiment, in the display device 3000, the upper surface of the red color filter 300R may be lower than the upper surface of the green color filter 300G and the upper surface of the green color filter 300G may be lower than the upper surface of the blue color filter 300B.

In other words, the thickness of the first portion A1 in which the overcoat layer 400 overlaps the upper surface of the red color filter 300R may be greater than the thickness of the second portion A2 in which the overcoat layer 400 overlaps the upper surface of the green color filter 300G and the thickness of the second portion A2 in which the overcoat layer 400 overlaps the upper surface of the green color filter 300G may be greater than the thickness of the third portion A3 in which the overcoat layer 400 overlaps the upper surface of the blue color filter 300B.

Accordingly, when the light transmittance of the overcoat layer 400 is measured, the light transmittance of about 600 nm to about 650 nm wavelength may be substantially similar to the light transmittance of about 500 nm to about 550 nm wavelength and the light transmittance of about 600 nm to about 650 nm wavelength may be kept lower than the light transmittance of about 450 nm to about 480 nm wavelength. Accordingly, the color purity of the light emitted from the light emitting structures LED1, LED2, and LED3 may be further improved and the reflectance by the external light may be further reduced. Accordingly, the display quality of the display device 3000 may be further improved.

In an embodiment, the upper surface of the red color filter 300R may be lower than the upper surface of the green color filter 300G by about 0.5 μm to about 1.5 μm. In some embodiments, the upper surface of the green color filter 300G may be lower than the upper surface of the blue color filter 300B by about 0.5 μm to about 1.5 μm. For example, the thickness of the first portion A1 of the overcoat layer 400 may be greater than the thickness of the second portion A2 by about 0.5 μm to about 1.5 μm and the thickness of the second portion A2 of the overcoat layer 400 may be greater than the thickness of the third portion A3 of the overcoat layer 400 by about 0.5 μm to about 1.5 μm. When a difference of height between the upper surfaces of the plurality of color filters 300R, 300G, and 300B satisfies the above-described range, the reflectance by the external light may be further reduced and the display quality of display device 3000 may be further improved.

When the upper surface of the red color filter 300R is lower than the upper surface of the green color filter 300G and the upper surface of the green color filter 300G is lower than the upper surface of the blue color filter 300B, as an example of the composition of the overcoat layer 400 in which the reflectance by the external light of the display device 2000 is reduced, the overcoat layer 400 may include a fifth dye D5, a sixth dye D6 and a yellow pigment P1.

Hereinafter, the fifth dye D5, the sixth dye D6, and the yellow pigment P1 will be described in more detail.

The fifth dye D5 may have a maximum absorption wavelength of about 590 nm to about 610 nm. Accordingly, the fifth dye D5 may absorb the light of a neon wavelength band. The sixth dye D6 may have a maximum absorption wavelength of about 500 nm to about 520 nm. Accordingly, the sixth dye D6 may absorb a light of a green wavelength band. Accordingly, the fifth dye D5 and the sixth dye D6 may be mixed with each other to reduce a light transmittance of a specific wavelength band without affecting a light transmittance of other wavelength bands.

In an embodiment, examples of the dye that can be used as the fifth dye D5 and the sixth dye D6 may include a tetraazaporphyrin-based dye, a porphyrin-based dye, an oxazine-based dye, a squaraine-based dye, a triarylmethane-based dye, a polymethine-based dye, an anthraquinone-based dye, a phthalocyanine-based dye, an azo-based dye, a perylene-based dye, a xanthene-based dye, a dimonium-based dye, and/or the like. For example, the fifth dye D5 may be a tetraazaporphyrin-based dye and the sixth dye D6 may be a porphyrin-based dye. The maximum absorption wavelength of the fifth dye D5 and the sixth dye D6 may be realized by adjusting substituents of each dye.

In an embodiment, a content (e.g., amount) of each of the fifth dye D5 and the sixth dye D6 may be about 0.01 wt % to about 0.5 wt % based on the total weight of the overcoat layer 400. When the content (e.g., amount) of each of the fifth dye D5 and the sixth dye D6 satisfies the above-described ranges, the reflectance by the external light may be further reduced and the display quality of the display device 3000 may be further improved.

Similarly, the yellow pigment P1 may reduce a light transmittance of a specific wavelength band without affecting a light transmittance of other wavelength bands.

The yellow pigment P1 and the green pigment P2 may be suitable pigments commonly used among pigments having yellow and green color, respectively. For example, the yellow pigment P1 may include a yellow pigment or a yellowish pigment and C.I. Pigment yellow-based pigments may be used for the yellow pigment P1. Examples of the C.I. pigment yellow-based pigment may include Pigment Yellow 13, Pigment Yellow 55, Pigment Yellow 119, Pigment Yellow 138, Pigment Yellow 139, Pigment Yellow 168, Pigment Yellow 185, and/or the like. For example, the yellow pigment P1 may be Pigment Yellow 185.

In an embodiment, a content (e.g., amount) of the yellow pigment P1 may be about 0.01 wt % to about 0.5 wt % based on the total weight of the overcoat layer 400. When the content (e.g., amount) of the yellow pigment P1 satisfies the above-described ranges, the reflectance by the external light may be further reduced and the display quality of the display device 2000 may be further improved.

According to embodiments, by suitably adjusting the relative heights of the upper surfaces of the red color filter 300R, the green color filter 300G, and the blue color filter 300B according to the composition of the overcoat layer 400, a light transmittance of the overcoat layer 400 for each wavelength band suitable for reducing the reflectance by the external light of the display device may be implemented. Accordingly, the color purity of the light emitted from the light emitting structures LED1, LED2 and LED3 may be improved, the reflectance by the external light may be reduced, and the display quality of the display device may be improved.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, expressions such as "at least one of a, b or c", "at least one selected from a, b and c", "at least one selected from the group consisting of a, b and c", etc., may indicate only a, only b, only c, both (e.g., simultaneously) a and b, both (e.g., simultaneously) a and c, both (e.g., simultaneously) b and c, all of a, b, and c, or variations thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although certain embodiments and implementations have been described herein, other embodiments and modifications will be apparent from this description. Accordingly, the present disclosure is not limited to such embodiments, but rather to the broader scope of the appended claims and one or more suitable obvious modifications and equivalent arrangements as would be apparent to a person of ordinary skill in the art.

What is claimed is:
1. A display device comprising:
a substrate;
a light emitting structure on the substrate;
a thin film encapsulation layer on the light emitting structure;
a color filter layer on the thin film encapsulation layer and comprising a red color filter configured to selectively transmit a red light, a green color filter configured to selectively transmit a green light, and a blue color filter configured to selectively transmit a blue light; and
an overcoat layer on the color filter layer and comprising at least one selected from a dye and a pigment,
wherein an upper surface of the red color filter is lower than an upper surface of the green color filter and is also lower than an upper surface of the blue color filter,
wherein a height of the upper surface of the green color filter and a height of the upper surface of the blue color filter are equal to each other,
wherein the overcoat comprises the dye,
wherein the dye comprises a first dye and a second dye, and
wherein a maximum absorption wavelength of the first dye is about 580 nm to about 590 nm and a maximum absorption wavelength of the second dye is about 420 nm to about 440 nm.

2. The display device of claim 1, wherein the overcoat layer comprises a first portion overlapping the upper surface of the red color filter, a second portion overlapping the upper surface of the green color filter, and a third portion overlapping the upper surface of the blue color filter, and
wherein a thickness of the first portion is greater than a thickness of the second portion and is also greater than a thickness of the third portion, and
wherein the thickness of the second portion and the thickness of the third portion are equal to each other.

3. The display device of claim 1, wherein the upper surface of the red color filter is lower than each of the upper surface of the green color filter and the upper surface of the blue color filter by about 0.5 μm to about 1.5 μm.

4. The display device of claim 1, wherein the first dye comprises a tetraazaporphyrin-based dye and the second dye comprises a porphyrin-based dye.

5. The display device of claim 1, wherein the overcoat comprises the pigment, and
wherein the pigment comprises a green pigment and a yellow pigment.

6. The display device of claim 1, wherein the overcoat comprises the dye and the pigment, and
Wherein a total content of the dye and the pigment is about 5 wt % or less based on a total weight of the overcoat layer.

7. The display device of claim 6, a content of the dye is about 0.01 wt % to about 2.5 wt % based on the total weight of the overcoat layer and a content of the pigment is about 0.01 wt % to about 2.5 wt % based on the total weight of the overcoat layer.

8. A display device comprising:
a substrate;
a light emitting structure on the substrate;
a thin film encapsulation layer on the light emitting structure;

a color filter layer on the thin film encapsulation layer and comprising a red color filter configured to selectively transmit a red light, a green color filter configured to selectively transmit a green light, and a blue color filter configured to selectively transmit a blue light; and an overcoat layer on the color filter layer and comprising at least one selected from a dye and a pigment, wherein an upper surface of the blue color filter is higher than an upper surface of the red color filter and is also higher than an upper surface of the green color filter, wherein a height of the upper surface of the red color filter and a height of the upper surface of the green color filter are equal to each other, wherein the overcoat comprises the dye, wherein the dye comprises a third dye and a fourth dye, and wherein a maximum absorption wavelength of the third dye is about 590 nm to about 610 nm and a maximum absorption wavelength of the fourth dye is about 480 nm to about 500 nm.

9. The display device of claim 8, wherein the overcoat layer comprises a first portion overlapping the upper surface of the red color filter, a second portion overlapping the upper surface of the green color filter, and a third portion overlapping the upper surface of the blue color filter, and wherein a thickness of the third portion is smaller than a thickness of the first portion and is also smaller than a thickness of the second portion, and wherein the thickness of the first portion and the thickness of the second portion are equal to each other.

10. The display device of claim 8, wherein the upper surface of the blue color filter is higher than each of the upper surface of the red color filter and the upper surface of the green color filter by about 0.5 μm to about 1.5 μm.

11. The display device of claim 8, wherein the third dye comprises a tetraazaporphyrin-based dye and the fourth dye comprises a porphyrin-based dye.

12. The display device of claim 8, wherein the overcoat comprises the pigment, and wherein the pigment comprises a yellow pigment.

13. A display device comprising:

a substrate;

a light emitting structure on the substrate;

a thin film encapsulation layer on the light emitting structure;

a color filter layer on the thin film encapsulation layer and comprising a red color filter configured to selectively transmit a red light, a green color filter configured to selectively transmit a green light, and a blue color filter configured to selectively transmit a blue light; and an overcoat layer on the color filter layer and comprising at least one selected from a dye and a pigment, wherein an upper surface of the red color filter is lower than an upper surface of the green color filter, wherein the upper surface of the green color filter is lower than an upper surface of the blue color filter, wherein the overcoat comprises the dye, wherein the dye comprises a fifth dye and a sixth dye, and wherein a maximum absorption wavelength of the fifth dye is about 590 nm to about 610 nm and a maximum absorption wavelength of the sixth dye is about 500 nm to about 520 nm.

14. The display device of claim 13, wherein the overcoat layer comprises a first portion overlapping the upper surface of the red color filter, a second portion overlapping the upper surface of the green color filter, and a third portion overlapping the upper surface of the blue color filter, wherein a thickness of the first portion is greater than a thickness of the second portion, and wherein the thickness of the second portion is greater than the thickness of the third portion.

15. The display device of claim 13, wherein the upper surface of the red color filter is lower than the upper surface of the green color filter by about 0.5 μm to about 1.5 μm, and Wherein the upper surface of the green color filter is lower than the upper surface of the blue color filter by about 0.5 μm to about 1.5 μm.

16. The display device of claim 13, wherein the fifth dye comprises a tetraazaporphyrin-based dye and the sixth dye comprises a porphyrin-based dye.

17. The display device of claim 13, wherein the overcoat comprises the pigment, and wherein the pigment comprises a yellow pigment.

* * * * *